United States Patent [19]

Bocko et al.

[11] Patent Number: 4,940,477
[45] Date of Patent: Jul. 10, 1990

[54] METHOD FOR SYNTHESIZING TOPAZ

[75] Inventors: Peter L. Bocko, Painted Post; David H. Crooker, Corning; Lina M. Echeverria, Painted Post, all of N.Y.

[73] Assignee: Corning Incorporated, Corning, N.Y.

[21] Appl. No.: 381,813

[22] Filed: Jul. 19, 1989

[51] Int. Cl.$^5$ .................... C03C 3/118; C03C 17/245
[52] U.S. Cl. ........................................ 65/18.2; 501/3;
501/59; 501/86; 423/328; 423/341; 423/465;
65/33; 65/DIG. 16
[58] Field of Search ............... 65/18.2, 33, DIG. 16;
501/3, 59, 86; 423/328, 328 C, 341, 465

[56] References Cited

U.S. PATENT DOCUMENTS

| | | | |
|---|---|---|---|
| 3,458,330 | 7/1969 | Baak | 501/3 |
| 3,661,601 | 5/1972 | Dumbaugh et al. | 501/59 |
| 4,501,602 | 2/1985 | Miller et al. | 65/18.2 |
| 4,645,524 | 2/1987 | Bocko et al. | 65/18.2 |

FOREIGN PATENT DOCUMENTS 0631065  11/1978  U.S.S.R. ................ 501/59

OTHER PUBLICATIONS

Abdel Rehim, A. M., "Thermal Study of Synthesis of Topaz", Thermal Analytical Procedures Int. Conf., 7th, vol. 1, 600–7, Unable to get a copy of paper, Supplying Abstract with action on CAS report.

*Primary Examiner*—Ferris H. Lander
*Assistant Examiner*—Melissa Bonner
*Attorney, Agent, or Firm*—Clinton S. Janes, Jr.

[57] ABSTRACT

The present invention is directed to a method for synthesizing fluorine-containing, aluminosilicate crystals having a stoichiometry approximating that of topaz. The method comprises three basic steps:

(1) vapors of a readily-oxidizable compound of silicon and of a readily-oxidizable compound of aluminum and fluorine are passed to a flame oxidation burner;

(2) amorphous fluorine-containing, aluminosilicate particles resulting from the combustion of those gases are collected; and (3) the collected particles are sintered into an integral body at a temperature between about 650°–925° C.

9 Claims, 1 Drawing Sheet

METHOD FOR SYNTHESIZING TOPAZ

BACKGROUND OF THE INVENTION

The occurrence of high-fluorine, high-alumina silicates in nature has been well documented in the scientific literature. Topaz, tourmaline, and amphiboles such as glaucophane represent examples of this class of minerals. Those silicates exhibit such properties as high hardness, pleochroism, piezoelectricity, piroelectricity, chemical durability, and thermal conductivity which strongly recommend research to investigate their utility in advanced ceramic and electro-optic applications.

Topaz, one of the principal fluorine-bearing minerals, comprises a solid solution between a fluorine end member, $Al_2SiO_4F_2$ (fluor-topaz) and a hypothetical hydroxyl end member, $Al_2SiO_4(OH)_2$. Naturally-occurring topaz contains significantly greater amounts of fluorine than hydroxyl, with samples ranging from nearly pure fluor-topaz, containing approximately 20% by weight fluorine, to a stoichiometry of about $Al_2SiO_4F_{1.4}(OH)_{0.6}$, containing approximately 13% by weight fluorine. Topaz is an orthosilicate of simple composition which typically crystallizes in orthorhombic symmetry, with cell parameters of a $\approx 4.65$ Å, b=8.79–8.83 Å (increasing as OH is substituted for F), and c$\approx$8.39 Å.

The physical and chemical properties of topaz render it a prime candidate for the formation of protective films. It exhibits a Mohs hardness of 8, below alumina and diamond only; it demonstrates extremely high chemical durability, even in concentrated acids including HF; its thermal conductivity of 55.9, which is quite comparable to that of alumina, is unusually high for a silicate; its density of 3.5 g/cc, although high for a silicate, is less than that of alumina and steels; and its exceptionally high level of fluorine suggests its utility in applications, such as culinary ware, where non-sticking characteristics are highly desirable.

The production of highly fluorinated ceramic materials has not been commercially practical because the extreme volatility of fluorine makes it difficult to introduce high concentrations of fluorine into ceramic powders or glasses, which difficulty is compounded when those powders are then sintered into an integral body or the glass is heat treated to crystallize it in situ.

Accordingly, the principal objective of the present invention was to devise a method for synthesizing crystals having a stoichiometry approximating that of topaz.

A specific objective of the instant invention was to devise a method for synthesizing crystals having a stoichiometry approximating that of topaz with a fluorine content between about 3–21%.

SUMMARY OF THE INVENTION

Those and other objectives can be achieved through the use of a particularly-defined chemical vapor deposition process. The production of ceramic bodies through chemical vapor deposition has been practiced at least since the preparation of fused silica described in U.S. Pat. No. 2,272,342. The process described there comprised three general steps:

(a) a hydrolyzable or readily oxidizable compound of silicon is vaporized;

(b) that vapor is passed into the flame of a combustible gas to decompose the vapor and to form very finely-divided particles of $SiO_2$; and (c) the $SiO_2$ particles are fired to vitrify them into a solid glass body.

Various modifications of that basic process have been practiced. To illustrate:

U.S. Pat. No. 2,326,059 discloses generating vapors of $SiCl_4$ and $TiCl_4$ (and optionally $AlCl_3$ and/or $ZrCl_4$), passing those vapors into a gas-oxygen burner to decompose the vapors and to form $SiO_2$—$TiO_2$ powder (with $Al_2O_3$ and/or $ZrO_2$ as optional dopants), and then vitrifying the powder.

U.S. Pat. No. 3,334,982 utilizes a stream of chlorine gas as the carrier for vapors of $SiCl_4$ and $AlCl_3$. Where desired, a stream of hydrogen can be used to entrain vapors of sodium. The apparatus consists of three concentric tubes. The chlorine gas with the vapors of $SiCl_4$ and $AlCl_3$ is passed through the central tube. A stream of oxygen is passed through the intermediate tube and the sodium vapors entrained within the stream of hydrogen passed through the outer tube. The mixture is ignited and the reaction product (a sodium aluminosilicate glass) collected.

U.S. Pat. Nos. 3,565,345, 4,136,828, and 4,417,692 describe the preparation of oxide glasses through thermal deposition of a metal halide wherein the burner construction contemplates the use of shield gases between the flame-providing gas and the stream of metal halide vapor. Those constructions were designed to prevent the build up of oxide powder (soot) on the nozzle of the burner.

In general, the past practice has utilized vapors generated by passing a carrier gas through a liquid, e.g., $SiCl_4$, either at ambient or somewhat elevated temperature. However, other researchers have fired powders, e.g., metal halides, at sufficiently high temperatures to vaporize them and those vapors are passed to a flame. U.S. Pat. Nos. 3,486,913 and 3,801,294 are illustrative of that practice.

U.S. Pat. No. 4,604,118 describes the preparation of $MgO$-$Al_2O_3$-$SiO_2$ glasses and ceramics through vapor deposition utilizing a burner construction of the type described in U.S. Pat. Nos. 3,565,345, 4,136,828, and 4,417,692, supra.

One of the difficulties encountered in attempts to produce silicate bodies containing high levels of fluorine is the extreme volatility of $SiF_4$ which, when formed, can carry away a large proportion of the fluorine, thereby making it unavailable for incorporation into the powder being deposited through thermal decomposition of the precursor material. Accordingly, care must be taken to utilize a readily-oxidizable source compound of fluorine wherein the fluorine is strongly bonded to aluminum such that the formation and volatilization of $SiF_4$ are inhibited. Organometallic compounds of aluminum have been found operable, a preferred embodiment being aluminum hexafluoroacetylacetonate [$Al(HFA)_3$].

Fluoride-containing aluminosilicate powders can be produced according to the present invention by providing a vapor source of silicon and another vapor source of aluminum and fluorine. The two vapors are delivered to a flame where they are thermally decomposed and react together to form the desired high fluorine aluminosilicate material. Hence, in the preferred embodiment $SiCl_4$ comprises the readily-oxidizable source of Si and $Al(HFA)_3$ constitutes the source of Al and F. Oxygen will commonly be employed as the carrier gas for $SiCl_4$ and argon will be used as the carrier gas for $Al(HFA)_3$. Whereas carrier gases and sources of $SiCl_4$ and $Al(H$-

FA)$_3$ can be utilized at ambient temperatures, yields of powder and greater levels of fluorine therein will be obtained at temperatures somewhat above ambient. Thus, delivery temperatures of SiCl$_4$ of at least 20° C., preferably at least 25° C., and up to about 50° C. will frequently be used, and delivery temperatures of Al(HFA)$_3$ in excess of 125° C., preferably about 140° C., and up to about 175° C. will typically be employed. The burner will be designed such that the two streams of compounds will be kept separate from one another until they are delivered into the flame. Thus, the burner is designed to provide a highly focused gas flame with means to provide a shielding gas between the stream of flame gas and between the streams of SiCl$_4$ and Al(HFA)$_3$.

Laboratory experience indicated that to assure a high level of fluorine in the deposited powders, an oxidizing flame is required. Consequently, a gas (normally methane)/oxygen flame will be used with oxygen being employed as the fume shields. Its use is especially vital as a shield between the streams of SiCl$_4$ and Al(HFA)$_3$ vapors. For example, if an inert gas such as argon or nitrogen is utilized, fluorine is lost; whereas in the presence of oxygen, fluorine is retained.

The flow rate of SiCl$_4$ vapor vis-a-vis that of Al(HFA)$_3$ also has a pronounced effect upon the overall amount of powder deposited and the concentration of fluorine in the powder. Laboratory experience has indicated that the flow rate of SiCl$_4$ vapor must be less than one-half that of the Al(HFA)$_3$, will preferably be no greater than one-fourth that of the Al(HFA)$_3$, and will most preferably be less than one-fifth that of the Al(HFA)$_3$.

In several experiments substrates were coated with powder by retaining them on a stainless steel wire screen placed in the stream of powder at a sufficient distance from the flame that the temperature in the environment was below 200° C. In order to determine the stoichiometry of the powder through wet chemical analysis, the deposit of powder was collected on filter paper.

In other experiments the substrates were held in the stream of powder by means of a vacuum. This practice permitted the substrate to be moved at various distances from the flame with relative ease. Very satisfactory deposits were secured in environments where the temperature approached 350° C. It was found, however, that temperatures of deposition in the vicinity of 500° C. and higher can result in volatilization of fluorine. Accordingly, depositions of powders will most preferably be carried out in environments where the temperature does not exceed 500° C.

In order to conduct experiments to sinter the powder into an integral film, samples were prepared by depositing powders directly from the powder stream, as described above, onto 1×2.5 cm rectangles cut from stainless steel or from the bottom of transparent glass-ceramic culinary ware marketed by Corning Incorporated, Corning, N.Y. under the trademark VISIONS having a composition and the microstructure described in U.S. Pat. No. 4,018,612. The powders were demonstrated to be amorphous in nature when examined through x-ray diffraction analysis.

As was emphasized above, volatilization of fluorine is an ever-present problem. Moreover, the development of unwanted fluorine compounds in addition to, and in place of, stoichiometric topaz provides another complicating factor. In the laboratory studies conducted, AlF$_3$ was a common reaction product, requiring care to inhibit its development. In order to monitor its presence, four standards were prepared for x-ray diffraction analyses comprising mixtures of naturally-occurring topaz with 5, 10, 25, and 50% by weight, respectively, AlF$_3$. For each concentration of AlF$_3$, the ratio of the topaz (111) peak to the topaz (111) peak+AlF$_3$ (220) peak was determined. That value, termed herein as the "topaz ratio," was employed to monitor the proportion of AlF$_3$ in the synthetic topaz. The AlF$_3$ (220) peak was chosen because it is a strong peak that does not coincide with any topaz or beta-quartz solid solution (the major component of the glass-ceramic comprising the culinary ware) peak. It will be appreciated that, as is usual with synthesized minerals, the peak positions exhibited by the topaz products of the present invention may be slightly removed from those of naturally-occurring topaz. However, such minor shift has an essentially negligible effect upon the precision and consistency of the results.

The sintering experiments were conducted in an electrically-heated tube furnace equipped with atmosphere variation and control capabilities. The observance of four parameters has been found necessary to assure high levels of fluorine in the sintered product.

First, the temperature for sintering should range between 650°–925° C. At temperatures below 650° C., the development of topaz is virtually non-existent, whereas at temperatures approaching 950° C. topaz is no longer a stable compound and decomposes to a mixture of fluorides with, occasionally, mullite. The preferred temperatures range about 700°–900° C.

Second, the times of sintering should be held below one hour. As can be appreciated, the rate of sintering increases as the temperature is raised. Nevertheless, as can also be appreciated, volatilization of fluorine, or even of the whole product from the substrate, occurs more rapidly at higher temperatures. Accordingly, whereas sintering times of one-half hour or more may be required at 650° C., periods of no more than 10–15 minutes are operable at the hotter extremes of the sintering temperature range.

Third, fluorine must be present in the sintering atmosphere. Hence, the absence of fluorine from the atmosphere will, at a minimum, result in a loss of fluorine, and may even lead to complete volatilization of the powder from the substrate. Consequently, fluorine must be present at a partial pressure high enough to inhibit volatilization of fluorine, but not excessive such that elimination of undesired fluorides can be achieved. That is, excess fluorine in the vapor phase appears to foster the development of fluorides in the reaction product. NF$_3$ proved quite operable in laboratory experiments and promoted high levels of fluorine in the sintered topaz product. SiF$_4$ was also found to be effective, but only in greater concentrations than NF$_3$. Furthermore, in order to attain complete suppression of extraneous fluoride formation, H$_2$O vapor must be present with SiF$_4$ to produce HF which, in turn, promotes the growth of fluor-topaz. This mixture of water vapor and SiF$_4$ can be achieved by passing a carrier gas, e.g., argon, through a water bath prior to mixing it with the SiF$_4$. Passing of SiF$_4$ through a water bath yields HF and SiO$_2$, the latter condensing and thereby hazarding plugging of the delivery system.

In summary, the ratio of fluorinated gas to carrier gas must be held below a certain value in order to suppress the formation of extraneous fluorides. As can be appreciated, that value varies with the nature of the gas. For $NF_3$, the value is 10%; for $SiF_4$, the value is $\leq 50\%$.

Fourth, although the powders can be sintered in an oxidizing, neutral, or reducing atmosphere to obtain synthetic topaz-containing products, only in sintering experiments conducted in a reducing atmosphere was it possible to obtain pure topaz and the essentially complete elimination of extraneous fluorides from the reaction product.

Because of its compatibility with $NF_3$, the preferred reducing atmosphere consists of a mixture of CO and $CO_2$, the optimum mixture being, by volume, $0.6CO_2 + 0.3CO + 0.1NF_3$. Use of the latter atmosphere at sintering temperatures of 700°-900° C. for times of 10-15 minutes yielded topaz with essentially no unwanted extraneous fluorides. Examinations of scanning electron micrographs of those products have indicated that the microstructure of this synthetic topaz consists of interlocking prismatic crystals ranging about 1-5 microns in length and averaging about 2-3 microns in length.

Where $SiF_4$ was utilized to provide the fluorine-containing gaseous environment, a combination of argon and water performed as the carrier gas. With such atmospheres sintering temperatures in the vicinity of 900° C. were preferably employed to assure the formation of topaz with essentially no unwanted extraneous fluorides.

An investigation of the cell parameters in the sintered synthetic topazes produced according to this invention has concluded that the products resulting from sintering temperatures in the neighborhood of 900° C., i.e., about 875°-925° C., contain more fluorine and, hence, are essentially pure fluor-topaz. In contrast, the products sintered at lower temperatures contain a significant amount of hydroxyl. Hence, reducing the sintering temperature causes the composition to shift toward the hydroxyl end member.

DESCRIPTION OF PREFERRED EMBODIMENTS

As has been described above, the method for producing bodies of high fluorine, aluminosilicate crystals, in particular bodies containing topaz crystals, comprises two basic steps:

First, amorphous powder of the desired composition is generated via chemical vapor deposition; and Second, that powder is heated to sinter it into an integral body and concurrently crystallize it in situ.

As was explained above in general terms, the first step involves bringing streams of vaporous materials to a flame wherein those materials react to form a deposit of amorphous powder having the desired high fluorine-containing, aluminosilicate composition. Nevertheless, because of the extreme volatility of $SiF_4$ which, when formed, carries away fluorine, the vaporous source of the fluorine must be chosen such that it is strongly bonded to aluminum, thereby inhibiting the formation and subsequent volatilization of $SiF_4$. This requirement led to the investigation of aluminum organometallic compounds as source materials.

It was recognized that there were two critical parameters which such compounds must satisfy:

(1) that they exhibit a high vapor pressure at a reasonable practical operating temperature; and (2) that the ligands on the aluminum complex contain a substantial excess of fluorine, i.e., greater than three fluorines per aluminum, which is needed to achieve the required fluorine uptake.

An investigation of compounds satisfying those parameters led to the determination that the $\beta$-diketonate aluminum hexafluoroacetylacetonate [Al(HFA)$_3$] constitutes the most preferred material because it has the highest vapor pressure and, therefore, does not require a high temperature vapor delivery system. Nevertheless, other diketonates such as [Al(HFA)$_2$(ACAC)], [Al(HFA)(ACAC)$_2$], [Al(TFA)$_3$], and [Al(FOD)$_3$] also satisfy the above two criteria. (ACAC = acetylacetone; TFA = trifluoroacetylacetone; FOD = heptafluorodimethyloctanedione).

Families of organoaluminum compounds other than the $\beta$-diketonates can also exhibit properties recommending their utility. For example, fluorine-substituted aluminum alkyls and fluorinated aluminum alkoxides can contain excess fluorine. Much more care must be taken in handling such compounds than the diketonates, however, because of their thermal and air sensitivity.

Figure 1:
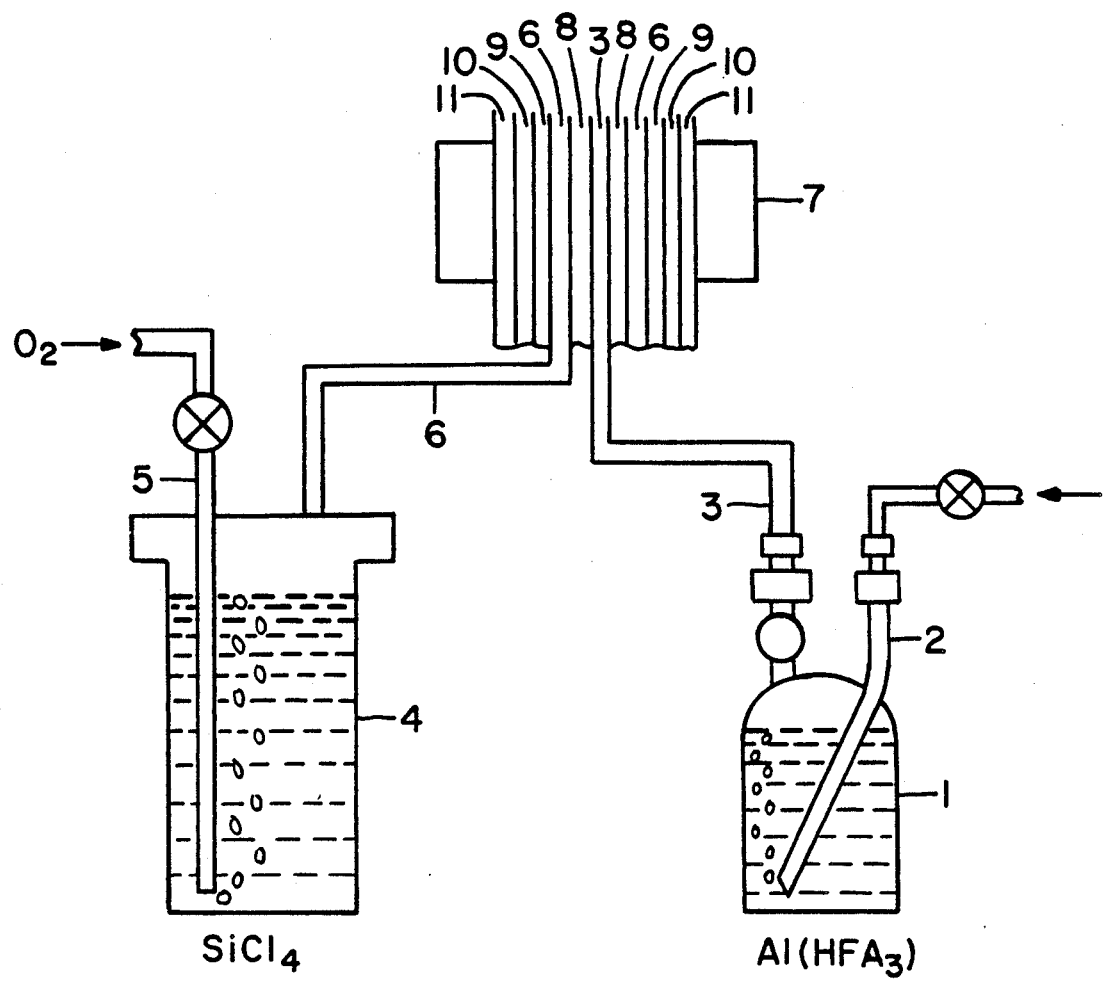
FIG. 1 is a schematic representation of vapor generating and delivery apparatus useful in producing the amorphous fluorine-containing aluminosilicate powder of the present invention.

Because of ease of use and relatively low cost, $SiCl_4$ was deemed to comprise the most preferred source of Si. Using those sources of vapors, the production of the desired amorphous powders will be illustrated utilizing the apparatus schematically represented in FIG. 1.

As shown there, Al(HFA)$_3$ vapor generator 1 comprises a glass flask containing a charge of liquid Al(HFA)$_3$ into which carrier gas delivery tube 2 injects an argon carrier gas from an argon source. The glass flask is heatable by a heating mantel, oil bath, or the like (not shown) to raise the vapor pressure of the Al(HFA)$_3$ therein to a suitable level ($\approx 125°-175°$ C). Argon saturated with Al(HFA)$_3$ vapors exits flask 1 into delivery line 3 which is heated, e.g., with electrical heating tape (not shown), to prevent vapor condensation therein.

$SiCl_4$ vapor generator 4 comprises a stainless steel canister containing liquid $SiCl_4$ into which carrier gas delivery tube 5 injects an oxygen carrier gas from an oxygen source. The canister is likewise heatable by a heating mantel, oil bath, or the like (not shown) to raise the vapor pressure of the $SiCl_4$ therein to a suitable level ($\approx 20°-50°$ C). Oxygen saturated with $SiCl_4$ vapors exits the canister into delivery line 6, which line is again heated, e.g., with electrical heating tape (not shown), to prevent vapor condensation therein.

Vapor delivery lines 3 and 6 are passed to burner 7 having a general configuration similar to that illustrated in U.S. Pat. No. 4,604,118, supra, where they are combined with an argon and/or oxygen fume shield gas line 8 (not shown), an oxygen inner shield gas line 9 (not shown), a combustible gas (methane/oxygen) line 10 (not shown), and an oxygen outer shield gas line 11 (not shown) to form a unit consisting of six concentric tubes leading into burner 7 and terminating at the face thereof. The oxygen of fume shield gas line 8 retards the interaction between the Al(HFA)$_3$ and $SiCl_4$ vapors such that oxidation of those vapors can proceed before they can interact to form undesired fluorides. The inner and outer shields 9 and 11, respectively, on either side of the combustible gas 10, are designed to shield the $SiCl_4$ and Al(HFA)₃ vapors from the effects of the flame until the vapors have traveled a distance away from the face of the burner, thereby precluding a deposit of powder building up on the face thereof.

In carrying out the vapor deposition process, the sequence of the four basic steps listed below is customarily followed:

(a) the stream of combustible gas (methane/oxygen) 10 is ignited to preheat the flame oxidation burner 7;
(b) the flows of fume shield 8, inner shield 9, and outer shield 11 are begun;
(c) Al(HFA)₃ generator 1 is heated via an oil bath to temperatures above 125° C. and SiCl₄ generator 4 is heated via a heating mantel to temperatures above 25° C.; and
(d) carrier gas flow to each of the generators is commenced; argon being supplied to the Al(HFA)₃ generator and oxygen being supplied to the SiCl₄ generator; in each case, the carrier gas is preheated to the temperature of the respective generator.

With the commencement of vapor flows to the flame oxidation burner, amorphous high fluorine-containing, aluminosilicate powder (or soot as it is frequently termed) is formed in and ejected from the flame to be deposited upon a suitable substrate.

Table I sets forth flow rates of the various gases in terms of liters/minute [the flow of Al(HFA)₃ was 1 liter/minute for all the examples], the temperature of the SiCl₄ and Al(HFA)₃ in ° C., and the weight percent of Al₂O₃, SiO₂, and fluorine in the powder as chemically analyzed.

TABLE I

| Example | SiCl₄ | SiCl₄ °C. | Al(HFA)₃ °C. | Flame CH₄ | Flame O₂ |
|---|---|---|---|---|---|
| 1 | 0.25 | 40 | 140 | 5.4 | 5.0 |
| 2 | 0.35 | 40 | 140 | 5.4 | 5.0 |
| 3 | 0.15 | 30 | 140 | 5.4 | 5.0 |
| 4 | 0.25 | 30 | 140 | 5.4 | 5.0 |
| 5 | 0.25 | 30 | 140 | 5.4 | 5.0 |
| 6 | 0.16 | 30 | 140 | 5.4 | 5.0 |
| 7 | 0.16 | 30 | 140 | 5.4 | 5.0 |
| 8 | 0.16 | 30 | 140 | 5.4 | 5.0 |
| 9 | 0.16 | 25 | 140 | 5.4 | 5.0 |
| 10 | 0.16 | 25 | 140 | 5.4 | 5.0 |
| 11 | 0.16 | 24 | 140 | 6.0 | 5.4 |
| 12 | 0.16 | 24 | 140 | 6.0 | 5.4 |
| 13 | 0.16 | 24 | 140 | 6.0 | 5.4 |
| 14 | 0.16 | 24 | 140 | 4.0 | 3.6 |
| 15 | 0.16 | 24 | 140 | 4.0 | 3.6 |
| 16 | 0.16 | 24 | 140 | 3.5 | 3.2 |
| 17 | 0.16 | 24 | 140 | 4.0 | 3.6 |
| 18 | 0.12 | 30 | 140 | 3.5 | 3.2 |
| 19 | 0.12 | 30 | 140 | 4.0 | 3.6 |
| 20 | 0.16 | 30 | 140 | 3.5 | 3.2 |
| 21 | 0.25 | 30 | 140 | 4.0 | 3.6 |
| 22 | 0.16 | 25 | 145 | 3.5 | 3.2 |
| 23 | 0.16 | 30 | 157 | 3.5 | 3.2 |
| 24 | 0.16 | 30 | 140 | 3.5 | 3.2 |
| 25 | 0.10 | 30 | 163 | 3.5 | 3.2 |
| 26 | 0.25 | 30 | 163 | 3.5 | 3.2 |
| 27 | 0.16 | 30 | 165 | 3.5 | 3.2 |
| 28 | 0.16 | 28 | 145 | 3.5 | 3.2 |

| Example | Fume Shield | Inner Shield | Outer Shield | % Al₂O₃ | % SiO₂ | % F₂ |
|---|---|---|---|---|---|---|
| 1 | 0.6 Ar | 3.8 | 2.4 | 0.3 | 99.0 | 0.03 |
| 2 | 0.6 Ar | 3.8 | 2.4 | 0.3 | 88.0 | 0.04 |
| 3 | 0.6 Ar | 3.8 | 2.4 | 68.1 | 31.5 | 1.78 |
| 4 | 0.6 Ar | 3.8 | 2.4 | 40.0 | 58.0 | 1.95 |
| 5 | 0.6 O₂ | 3.8 | 2.4 | 45.3 | 47.3 | 8.20 |
| 6 | 0.6 O₂ | 3.8 | 2.4 | 60.2 | 28.8 | 6.99 |
| 7 | 1.9 O₂ | 3.8 | 2.4 | 59.0 | 31.0 | 8.00 |
| 8 | 3.0 O₂ | 3.8 | 2.4 | 55.0 | 33.0 | 9.00 |
| 9 | 0.5 O₂ | 3.8 | 2.4 | 51.1 | 27.7 | 6.77 |
| 10 | 0.5 Ar / 0.2 O₂ / 0.8 Ar | 3.8 | 2.4 | 53.9 | 37.1 | 6.60 |
| 11 | 3.0 O₂ | 1.0 | 3.7 | 49.7 | 31.1 | 12.50 |
| 12 | 3.0 O₂ | 3.0 | 3.7 | 54.7 | 30.5 | 9.30 |
| 13 | 2.8 Ar | 1.0 | 3.7 | 58.8 | 27.6 | 9.60 |
| 14 | 3.0 O₂ | 1.0 | 3.7 | 51.0 | 28.7 | 10.50 |
| 15 | 3.0 O₂ | 3.0 | 3.7 | 51.3 | 29.6 | 11.50 |
| 16 | 5.0 O₂ | 1.0 | 3.7 | 58.4 | 25.3 | 12.30 |
| 17 | 3.0 O₂ | 4.0 | 3.7 | 56.6 | 29.3 | 9.30 |
| 18 | 5.0 O₂ | 1.0 | 3.7 | N.A. | N.A. | 16.20 |
| 19 | 0.3 Ar | 2.4 | 3.7 | N.A. | N.A. | 9.60 |
| 20 | 5.0 O₂ | 1.0 | 3.7 | 42.6 | 28.5 | 19.20 |
| 21 | 0.3 Ar | 2.4 | 3.7 | N.A. | N.A. | 10.60 |
| 22 | 5.0 O₂ | 1.0 | 3.7 | 53.8 | 26.0 | 16.50 |
| 23 | 5.0 O₂ | 1.0 | 3.7 | 38.2 | 39.0 | 16.20 |
| 24 | 5.0 O₂ | 1.0 | 3.7 | 36.2 | 42.0 | 15.20 |
| 25 | 5.0 O₂ | 1.0 | 3.7 | 70.0 | 11.4 | 14.20 |
| 26 | 5.0 O₂ | 1.0 | 3.7 | 72.9 | 11.5 | 14.30 |
| 27 | 5.0 O₂ | 1.0 | 3.7 | 64.2 | 12.3 | 16.20 |
| 28 | 5.0 O₂ | 1.0 | 3.7 | 48.4 | 21.6 | 21.00 |

N.A. = not analyzed

Several general observations can be made with respect to Table I. A highly oxidizing flame is necessary to promote high concentrations of fluorine in the soot. That is, every increase in the oxidizing nature of the flame, whether in the inner shield, the fume shield, or in the outer shield, or in the flow rates thereof, resulted in an increase in the fluorine level in the powder. The nature of the fume shield appears to be especially critical. For example, the retention of fluorine in the powder is generally much less where argon gas comprises the fume shield than where oxygen gas forms the fume shield. There appears to be an inverse correlation between the fluorine content of the amorphous powder and the flow rate of SiCl₄ vapor. The temperatures of the SiCl₄ and Al(HFA)₃ vapors as they enter the burner appear to have a minor effect upon the stoichiometry of the powder. The flow rate of the CH₂/O₂ combustible gas does not appear to exert any substantive effect upon the stoichiometry of the soot.

As was explained above in general terms, the sintering step to produce integral bodies of high fluorine, aluminosilicate compositions comprehends subjecting the amorphous soot to a heat treatment involving four parameters:

(a) temperatures between about 650°–925° C., preferably 700°–900° C.;
(b) sintering times below one hour, preferably below one-half hour;
(c) an atmosphere containing fluorine; and
(d) although sintering may be carried out in oxidizing and neutral environments, the highest levels of fluorine in the final product, i.e., to synthesize essentially stoichiometric topaz, are only secured in reducing environments.

Figure 2:
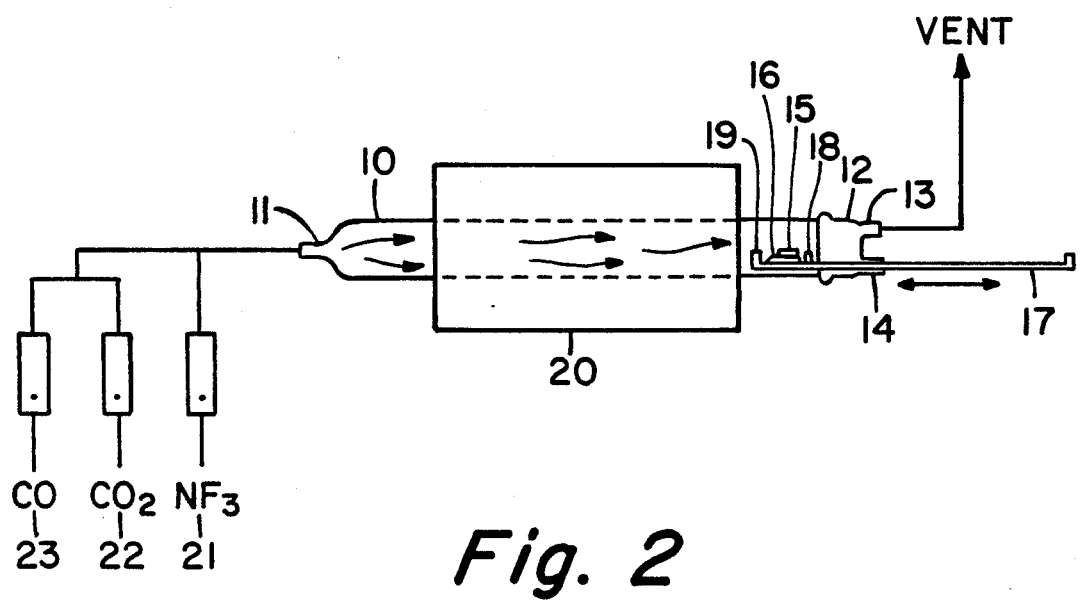
FIG. 2 is a schematic representation of apparatus useful in sintering the generated amorphous powder into an integral crystalline body.

As was also described above, amorphous powder from the flame was deposited on rectangular samples of stainless steel or a transparent glass-ceramic. NF₃ constituted the preferred fluorine-containing atmosphere, although a combination of SiF₄ and H₂O vapors was also operable for that purpose. Finally, the preferred reducing atmosphere consisted of a mixture of CO and CO₂. FIG. 2 provides a schematic illustration of a laboratory electrically-heated tube furnace equipped with atmosphere variation and control capabilities.

As pictured there, 10 represents generally a glass tube formed from Corning Code 7690, a refractory 96% silica glass marketed by Corning Incorporated, Corning, N.Y. under the trademark VYCOR. Tube 10 has a concentrically-reduced end portion 11 providing a port therein and an open end portion which is covered by a replaceable cap 12. Cap 12, which was also fashioned from Corning Code 7690 glass, has ports 13 and 14 to permit the exhaust of gases (through port 13) in order to vary the atmosphere within tube 10, and to permit the movement (through port 14) of sample 15 on sample holder 16 which rests on rod 17 between baffles 18 and 19, the latter being integral with rod 17. Sample holder 16 and rod 17 were likewise fabricated from Corning Code 7690 glass. That construction allows the rapid insertion of sample 15 into the hot zone of furnace 20 without opening furnace 20 or disturbing the atmosphere therein. To provide the atmosphere in furnace 20, $NF_3$ gas from source 21 was mixed with a combination of $CO_2$ gas from source 22 and CO gas from source 23, and that mixture was passed through port 11 into tube 10 and thence vented out through port 13.

In operation, sample 15 was positioned within tube 10 and cap 12 placed on tube 10 with rod 17 extending thereout through port 14. Sources of 21, 22, and 23 were connected to inport 11 and the gases flowed therethrough to purge the atmosphere in tube 10 of air. (If desired, gaseous nitrogen or argon may be utilized to purge the tube atmosphere and the flows of $NF_3$, $CO_2$, and CO thereafter commenced.) The flow of gases was continued until essentially all of the air had been removed, thereby assuring a reducing environment in tube 10.

Sample 15 was then quickly introduced via movement of rod 17 into the zone of furnace 20 wherein the desired temperature within the range of 650°–925° C. is located. After a previously determined exposure period, sample 15 was quickly withdrawn from furnace 20, but held within tube 10 with cap 12 in place, in order to cool under reducing conditions in an active flow of the gases.

Table II sets forth a soot composition example from Table I, the sintering temperature in °C., the hold time at that temperature in minutes, the gaseous atmosphere within the furnace tube, the flow rate in liters/minute of the gaseous atmosphere within the furnace tube, and the topaz index. In each example except 15, the sample was quickly introduced into the hot zone of furnace, whereas in Example 15 the sample was heated at about 5° C./minute. Stainless steel comprised the substrate in the last three treatments of Example 28; the above-described transparent glass-ceramic constituted the substrate in all of the other examples.

TABLE II

| Ex. | Temp | Hold | Flow | Atmosphere | Index |
|---|---|---|---|---|---|
| 15 | 800 | 15 | 1.1 | 0.9 air/0.1 $NF_3$ | 0.13 |
| 8 | 700 | 15 | 1.1 | 0.9 Ar/0.1 $NF_3$ | 0.33 |
| 8 | 800 | 15 | 1.1 | 0.9 Ar/0.1 $NF_3$ | 0.90 |
| 16 | 800 | 30 | 1.1 | 0.9 Ar/0.1 $NF_3$ | 0.25 |
| 18 | 800 | 15 | 1.1 | Ar | Vol. |
| 21 | 900 | 30 | 0.55 | 0.6 $CO_2$/0.3 CO/0.1 $NF_3$ | Vol. |
| 21 | 950 | 10 | 0.55 | 0.6 $CO_2$/0.3 CO/0.1 $NF_3$ | None |
| 22 | 800 | 15 | 0.55 | 0.8 He(HCl)/0.2 $NF_3$* | 0.80 |
| 22 | 800 | 15 | 1.1 | 0.49 He/0.01 Cl/0.3 $O_2$/0.2 $NF_3$ | <<0.01 |
| 22 | 700 | 15 | 1.1 | 0.5 He/0.3 $O_2$/0.2 $NF_3$ | <<0.06 |
| 24 | 650 | 45 | 1.1 | 0.9 Ar(HCl)/0.1 $NF_3$ | <0.86 |
| 28 | 800 | 10 | 0.55 | 0.6 $CO_2$/0.3 CO/0.1 $NF_3$ | 1.00 |
| 28 | 850 | 10 | 0.55 | 0.6 $CO_2$/0.3 CO/0.1 $NF_3$ | 1.00 |
| 28 | 850 | 10 | 0.55 | 0.89 Ar/0.01 Cl/0.1 $NF_3$ | 1.00 |
| 28 | 900 | 10 | 0.55 | 0.89 Ar/0.01 Cl/0.1 $NF_3$ | <<0.01 |
| 28 | 900 | 10 | 0.55 | 0.6 $CO_2$/0.3 CO/0.1 $NF_3$ | 1.00 |
| 28 | 900 | 10 | 0.55 | 0.5 Ar($H_2O$)/0.5 $SiF_4$ | 1.00 |
| 28 | 900 | 10 | 0.55 | 0.33 $CO_2$/0.17 CO + $H_2O$/0.5 $SiF_4$ | 1.00 |
| 28 | 600 | 15 | 0.55 | 0.6 $CO_2$/0.3 CO/0.1 $NF_3$ | None |
| 28 | 700 | 15 | 0.55 | 0.6 $CO_2$/0.3 CO/0.1 $NF_3$ | 1.00 |
| 28 | 650 | 45 | 0.55 | 0.6 $CO_2$/0.3 CO/0.1 $NF_3$ | None |
| 28 | 900 | 10 | 0.55 | 0.45 $CO_2$/0.45 CO/0.1 $NF_3$ | 1.0 |
| 28 | 900 | 10 | 0.55 | 0.6 $CO_2$/0.3 CO/0.1 $NF_3$ | 1.0 |
| 28 | 900 | 10 | 0.55 | 0.2 $CO_2$/0.72 CO/0.07 $NF_3$ | 1.0 |

*Argon bubbled through 6N HCl
**Argon bubbled through distilled $H_2O$

Several conclusions can be drawn from Table II. To illustrate:

First, topaz can be synthesized at temperatures of at least 650° C., but below 950° C. Synthetic topaz could be produced at 650° C. in a neutral atmosphere, but complete elimination of extraneous fluorides was not attained (see Example 24). Topaz is not stable at 950° C. and decomposes into a mixture of fluorides with, occasionally, mullite, such as is demonstrated in Example 21. Hence, a firing temperature of about 925° C. is deemed to constitute a practical maximum. The development of extraneous fluorides appears to be more effectively suppressed in neutral atmospheres when higher firing temperatures are employed, as is exemplified in Example 8 at 700° C. and Example 8 at 800° C., both in Ar/$NF_3$, with topaz ratios of 0.33 and 0.90, respectively. The effect of sintering temperature does not appear to be very significant where reducing atmospheres are utilized, provided that the lower and upper extremes are avoided. Hence, fluor-topaz has been generated by sintering (Example 28) at temperatures of 700° C., 800° C., 850° C., and 900° C.

Second, sintering times required for the crystallization of topaz are at least about five minutes, but less than one hour, and are generally on the order of 10–15 minutes. Sintering times will preferably be held below 30 minutes inasmuch as longer times hazard volatilization of fluorine or even of the entire sample (Example 21). Example 24 utilized long firing times at 650° C., but total elimination of extraneous fluorides was not achieved.

Third, slow heating rates appear to yield increased proportions of undesired fluorides in the final product, as can be observed in a comparison of Example 15 with Example 8. That phenomenon seems to be particularly present when sintering temperatures of 700°–800° C. are utilized. Hence, optimum products appear to result when the samples are plunged into the sintering zone of the furnace.

Fourth, the absence of fluorine from the furnace atmosphere leads to a loss of fluorine, or even complete volatilization of the soot. That circumstance can be seen through a comparison of Example 18, where all of the sample volatilized, with Example 8 having a topaz ratio of 0.90. Nevertheless, excess fluorine in the atmosphere can lead to the development of extraneous fluorides in the final product. Consequently, the ratio of fluorinated gas to carrier gas must be kept below a prescribed value to suppress this formation of fluorides. As noted above, this value varies with the gas; for $NF_3$ it must be $\leq 10\%$ and for $SiF_4 \leq 50\%$.

Fifth, an oxidizing atmosphere appears to exert a very adverse effect upon the level of topaz that will be present in the final product. That fact can be seen in the three treatments of Example 22. Whereas, a relatively high concentration of topaz can be formed utilizing a neutral atmosphere, it appears that a reducing atmosphere is necessary to assure the complete elimination of fluorides from the final product.

We claim:

1. A method for preparing bodies consisting essentially of synthesized fluorine-containing, aluminosilicate crystals having a stoichiometry approximating that of topaz with a fluorine content between 3–21% by weight consisting essentially of the steps of:
   (a) generating and supplying to a flame oxidation burner, vapors of a readily-oxidizable compound of silicon and of a readily-oxidizable compound of aluminum and fluorine, in which the fluorine is strongly bonded to the aluminum, said vapors being supplied in separate streams;
   (b) injecting the vapors into an oxidizing combustion flame supported by said burner, the two streams of vapors being passed into said flame in separate streams with an interposing fume shield gas stream free of said silicon-containing vapor and of said aluminum-and fluorine-containing vapor being passed into said flame between said two streams;
   (c) collecting amorphous fluorine-containing aluminosilicate particles produced from combustion of said two streams of vapors by said flame; and then
   (d) sintering said particles into an integral body and concurrently crystallizing it in situ by firing said particles in a fluorine-containing atmosphere at a temperature of 650°–925° C.

2. A method according to claim 1 wherein said readily-oxidizable compound of silicon is $SiCl_4$.

3. A method according to claim 1 wherein said readily-oxidizable compound of aluminum and fluorine, in which the fluorine is strongly bonded to the aluminum, is an aluminum organometallic compound.

4. A method according to claim 3 wherein said aluminum organometallic compound is aluminum hexafluoroacetylacetone.

5. A method according to claim 1 wherein said interposing fume shield gas consists of oxygen.

6. A method according to claim 1 wherein said particles of fluorine-containing, aluminosilicate are collected at a distance from said flame where the temperature is below 500° C.

7. A method according to claim 1 wherein said particles are sintered in a fluorine-containing, reducing atmosphere.

8. A method according to claim 7 wherein the time for sintering said particles ranges about 5–60 minutes.

9. A method according to claim 8 wherein said particles are sintered at a temperature of 700°–900° C. for 10–15 minutes.

* * * * *